(12) United States Patent
Killat et al.

(10) Patent No.: US 7,250,886 B1
(45) Date of Patent: Jul. 31, 2007

(54) SIGMA-DELTA MODULATOR

(75) Inventors: Dirk Killat, Kirchheim/Teck (DE);
Andreas Adler, Schlierbach (DE)

(73) Assignee: Dialog Semiconductor GmbH,
Kirchheim/Teck-Nabern (DE)

( * ) Notice: Subject to any disclaimer, the term of this patent is extended or adjusted under 35 U.S.C. 154(b) by 0 days.

(21) Appl. No.: 11/384,760

(22) Filed: Mar. 20, 2006

(51) Int. Cl.
*H03M 3/00* (2006.01)

(52) U.S. Cl. ...................................... 341/143; 341/150
(58) Field of Classification Search ......... 341/136–170
See application file for complete search history.

(56) References Cited

U.S. PATENT DOCUMENTS

| | | | |
|---|---|---|---|
| 5,030,954 A * | 7/1991 | Ribner | 341/143 |
| 5,148,166 A * | 9/1992 | Ribner | 341/143 |
| 5,148,167 A * | 9/1992 | Ribner | 341/143 |
| 5,661,432 A * | 8/1997 | Chang et al. | 327/552 |
| 6,160,506 A | 12/2000 | Pellon | |
| 6,310,512 B1 * | 10/2001 | Briskin et al. | 327/552 |
| 6,369,730 B1 | 4/2002 | Blanken et al. | |
| 6,734,723 B2 * | 5/2004 | Huijsing et al. | 330/9 |
| 6,891,488 B1 | 5/2005 | McDaniel et al. | |
| 6,907,374 B1 | 6/2005 | Tsyrganovich | |

OTHER PUBLICATIONS

"A 10aV-Offset 8k Hz Bandwidth 4th-Order Chopped Sigma-Delta A/D Converter for Battery Management", by Peter G. Blanken et al., ISSCC 2002, Session 23/ Analog Techniqued.
23.5, 2002 IEEE Int'l Solid-State Circuits Conf.
2002 IEEE Int'l Solid-State Circuits Conf., "Outline".

* cited by examiner

*Primary Examiner*—Lam T Mai
(74) *Attorney, Agent, or Firm*—Saile Ackerman LLC; Stephen B. Ackerman

(57) ABSTRACT

Circuits and methods to achieve a low-noise and low offset continuous sigma-delta modulator used e.g. for battery management are disclosed. Continuous integration of input is enabled by special switching principle of three parallel integrators. Precharging of integrator output in so called pre-run mode minimizes integrator leakage and non-ideal effects by connecting a Gm in pre-run mode either to input voltage or to a reference voltage depending this Gm is being used in a following clock period. Parasitic effects due to switching at first integration capacitor are minimized by using buffer amplifiers tracking the voltage on integration capacitors.

26 Claims, 8 Drawing Sheets

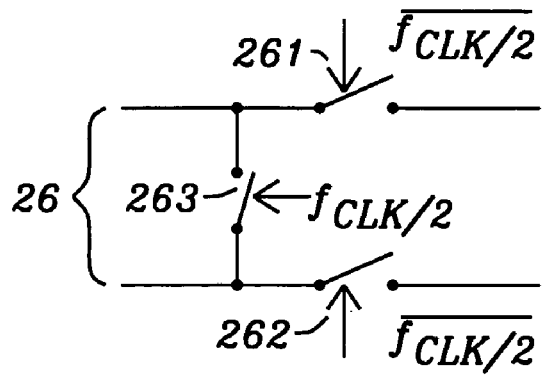
FIG. 2a
FIG. 2b
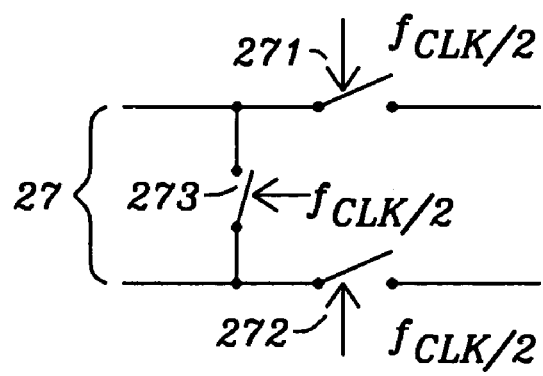
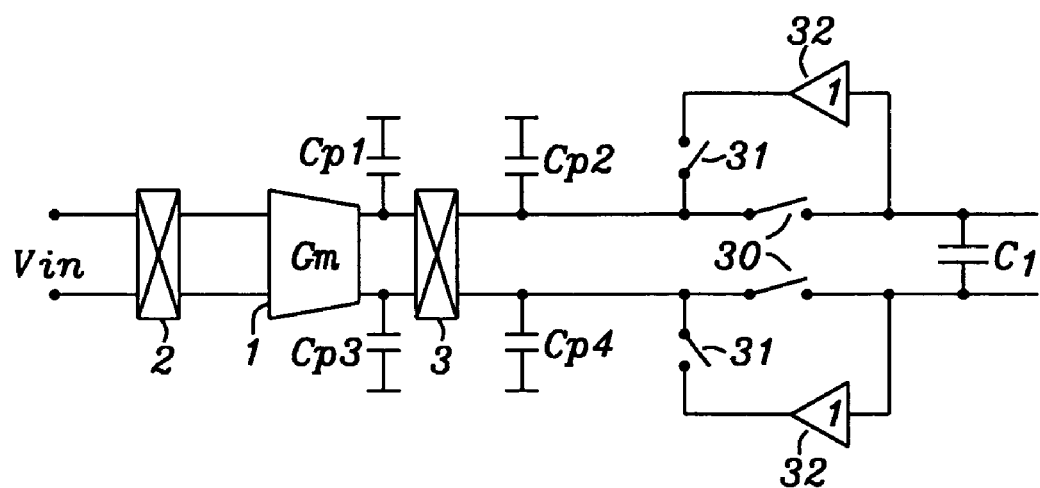
FIG. 3

SIGMA-DELTA MODULATOR

BACKGROUND OF THE INVENTION (1) Field of the Invention

This invention relates generally to analog-to digital converters and relates more particularly to low-noise and low offset continuous-time Sigma-Delta Modulators. The principle can be used also for many continuous-time modulators, because it replaces the necessity for return-to-zero code (RZ) and hence improves ISI and distortion. The disadvantage of RZ code is degrading of frequency characteristics.

(2) Description of the Prior Art

Oversampling modulation techniques have become popular today for high-resolution analog signal processing applications such as data conversion and signal generation. The major reason for their popularity comes about because their implementations rely less on the matching of analog components and amplifier gains, and more on digital signal processing. This is advantageous today as submicron VLSI technologies are more amenable for integrating complex digital signal processing operations than analog operations.

Sigma-delta converters offer high resolution, high integration, and low cost, making them a good ADC choice for applications such as process control and weighing scales. The Sigma-Delta ($\Delta\Sigma$) modulation is a kind of analog-to-digital signal conversion derived from the delta modulation.

It is a challenge for the designers of sigma delta modulators to achieve low noise and low offset continuous time delta-sigma modulators wherein inter-symbol-interference (ISI) is kept to a minimum. ISI arises from the fact that the channel performs a linear convolution of its impulse response with the time-domain waveform. This means that independent symbols affect each other; one symbol "bleeds" into another.

A known solution to circumvent this non-linear effect is to implement a return-to-zero scheme, as disclosed in U.S. Pat. No. (6,369,730 to Blanken et al.). A return-to-zero switch switches the output current $i_{DAC}$ of a second voltage-to-current converter to zero for part of a clock period T. This return-to-zero switching in the feedback branch takes place synchronously with the sampling frequency of the sigma-delta modulator. Furthermore Blanken et al. disclose that said output current can be switched to zero in parallel with the input to avoid mismatch in frequency characteristics.

Another solution is described in ISSCC' 02: "A 10 µV-offset 8 kHz Bandwidth $4^{th}$ order Chopped sigma-Delta A/D converter for Battery management". A DAC signal switches in a chopping frequency the polarity of a reference voltage at the input of transconductors. Three transconductors are used wherein one of them is always connected to zero-input to realize return to zero principle There are more known patents dealing with the design of delta-sigma modulators:

U.S. Pat. No. (6,160,506 to Pellon) proposes a sigma-delta analog-to-digital feedback converter arrangement achieving low noise and a wide dynamic range by use of a directional coupler as a summing device for generating the difference signal on which the forward sigma-delta analog-to-digital converter operates. The feedback is provided by a digital-to-analog reconstructor, which applies the reconstructed analog signal to the tap of the directional coupler, in which the feedback signal is summed with the analog input signal. A low-noise amplifier is coupled to the output of the directional coupler at which the difference signal appears, so the dynamic range of the signal traversing the low-noise amplifier is small. The high isolation between the tap of the directional coupler and the source of analog signals allows the use of an input bandpass filter.

U.S. Pat. No. (6,891,488 to McDaniel et al.) discloses an Nth-order sigma-delta analog-to-digital converter (ADC) system having multilevel quantized feedback. A multilevel quantized feedback stage incorporates a multibit, current-mode digital-to-analog converter (DAC). In one embodiment, reference current sources for the DAC may comprise a plurality of floating-gate MOS transistors so that analog nonvolatile precision linearity trimming of the feedback DAC may be accomplished. Calibration of the DAC may be performed at a relatively low refresh rate, for example, only at instances when the sigma-delta ADC system is activated.

U.S. Pat. No. (6,907,374 to Tsyrganovich) discloses a self-calibrating sigma-delta converter (SCADC) functioning in a calibration mode and in an operational mode. In the calibration mode, a test circuit of the SCADC generates test signals that are periodic rectangular voltage waveforms. Each test signal has a dc component with a precise voltage amplitude, as well as harmonic components. A low-pass filter of a sigma-delta converter (SDC) within the SCADC filters out the harmonic components. A digital calibration processing circuit within the SCADC uses the precise voltage amplitudes to generate digital correction factors that compensate for dc offset error, gain error and INL error of the SDC. In the operational mode, the SDC receives an analog operational signal and outputs an operational digital data stream. The digital calibration processing circuit uses the correction factors to compensate for dc offset error, gain error and INL error in the operational digital data stream and outputs a corrected digital data stream.

SUMMARY OF THE INVENTION

A principal object of the present invention is to achieve methods and circuits for a low noise and low-offset continuous time sigma-delta modulator.

A further object of the present invention is to achieve a sigma-delta modulator eliminating parasitic effects due to switching.

Another further object of the present invention is to achieve a sigma-delta modulator requiring small integration resistors and high linearity, together with low chip size and very low clock frequency.

In accordance with the objects of this invention a method to achieve accurate switching characteristics of a delta-sigma-modulator has been achieved. The method invented comprises, first, to provide a delta-sigma modulator having n-modulation stages wherein at the output of the sigma-delta modulator is a 1-bit quantizer followed by a switch and a first modulation stage comprises in a first branch an analog input voltage, a differential Gm integrator, having at its inputs and output each a first category chopping switching means and a capacitor, and a second branch, being parallel to said first branch comprises a reference voltage, a differential Gm integrator, having at its inputs and output each a first category chopping switching means, and a second category of chopping switching means being connected to said capacitor. The following steps of the method invented comprise to drive said first category chopping switching means, being connected to the inputs and outputs of said differential Gm integrators with a chopping frequency $f_{CHOP}$, to drive said switch at the output of the sigma-delta modulator with a frequency of an internal clock $f_{CLOCK}$ of the sigma-delta modulator, and to drive said additional chopping multiplexer being connected to said capacitor with a chopping frequency $f_{CLOCK}$.

In accordance with the objects of this invention another method to achieve accurate switching characteristics of a delta-sigma-modulator has been achieved. The method invented comprises, first, to provide a delta-sigma modulator having n-modulation stages, wherein at the output of the sigma-delta modulator is a 1-bit quantizer followed by a first switching means and a first modulation stage comprises in a first branch an analog input voltage, a differential Gm integrator, having at its input and output each a first category of chopping switching means and a capacitor. Furthermore, a second branch comprises a reference voltage, a differential Gm integrator, having at its input and output each a chopping multiplexer, and a second category of chopping switching means being connected to said capacitor. Moreover a third branch, having also said reference voltage as input, comprises a differential Gm integrator, having at its input and output each said first category of chopping switching means, and a second category of chopping switching means being connected to said capacitor, and a switching means being connected to said second and third branch. The following steps of the method invented comprise to drive said first category of chopping switching means, alternating cyclically the polarity of its input and being connected to the inputs and outputs of said differential Gm integrators with a chopping frequency $f_{CHOP}$, to drive said switch at the output of the sigma-delta modulator with a frequency of an internal clock $f_{CLOCK}$ of the sigma-delta modulator. The last two steps comprise to drive said second category of chopping switching means, alternating cyclically the polarity of its input being connected to said capacitor with a chopping frequency $f_{CLOCK}$ and to disconnect and short using said switching means being connected to said second and third branch exclusively either the output of said second differential Gm integrator or the output of said third differential integrator.

In accordance with further objects of this invention a delta-sigma modulator having accurate switching characteristics has been achieved. The sigma-delta modulator comprises n-modulation stages and at its output a 1-bit quantizer followed by an output switching means, clocked by an internal clock. The first modulation stage comprises an analog input voltage to be converted to a digital voltage, an analog reference voltage, an integration capacitor at the output of said first stage being connected to following modulation stages of said sigma-delta modulator, and three parallel integrating branches. Each of these three branches comprises a first switching means switching between said analog input voltage and said analog reference voltage, a second switching means, alternating cyclically the polarity of its input wherein its input is connected to said first switching means and its output is connected to the input of a first differential Gm integrator, and said first differential Gm integrator wherein its output is the input to a third switching means. Finally each branch comprises said third switching means, alternating cyclically the polarity of its input from said first differential Gm integrator and its output is connected to fourth switching means and said fourth switching means connecting or disconnecting the output of said third switching means to said integration capacitor.

In accordance with further objects of this invention a method to eliminate charge errors caused by parasitic capacitances of delta-sigma modulators has been achieved. The method invented comprises, first, to provide in a first modulation stage a first switching means for both positive and negative connections between a chopped output of a differential Gm integrator and a correspondent integration capacitor and two buffer amplifiers in series with a second switching means, wherein a first buffer amplifier is parallel to said positive connection and a second buffer amplifier is parallel to said negative connection. The following steps of the method invented are to open said first switching means and close said second switching means a short period of time before the chopper at the output of said Gm integrator switches, to precharge the output nodes of the Gm integrator using said buffer amplifiers tracking the voltage on the capacitor nodes, and to close said first switching means and open said second switching means.

In accordance with further objects of this invention a circuit to eliminate charge errors caused by parasitic capacitances due to switching at integration capacitor of a first modulation stage of a sigma-delta modulator has been achieved. The circuit invented comprises, first, an integration capacitor, and a first switching means in both connections between a chopped output of a differential Gm-integrator and said integration capacitor of the first modulation stage. Furthermore the circuit invented comprises two buffer amplifier each in series with a second switching means, wherein each of said buffer amplifiers is in parallel to one of both connections between said capacitor and said chopped output and wherein the input of said buffer amplifiers is on the side of a terminal of said integration capacitor.

In accordance with further objects of this invention a method to achieve accurate switching characteristics of a delta-sigma-modulator has been achieved. The method invented comprises, first, to provide a first modulation stage of a sigma-delta modulator having three parallel Gm branches, an analog input voltage, an analog reference voltage, an integration capacitor, and a DAC signal signifying the sign of the output of the modulator, and switching means. The following steps of the method comprise to assign exclusively at a point of time a first Gm branch as input Gm having its input connected to said input voltage and its output connected to said integration capacitor, to assign exclusively at a point of time a second Gm branch as "DAC" Gm having its input connected to said reference voltage and its output connected to said integration capacitor, and to assign exclusively at a point of time a third Gm branch as "pre-run" mode Gm having its input connected to either said input voltage or to said reference voltage and its output disconnected from said integration capacitor. The last step comprises to interchange periodically the assignments of the three Gm branches to either input Gm, "DAC" Gm, or "pre-run" mode Gm, wherein an input Gm mode is always preceded by a pre-run mode of the same Gm being connected to said input voltage and wherein the DAC channel must change if DAC changes polarity.

BRIEF DESCRIPTION OF THE DRAWINGS

In the accompanying drawings forming a material part of this description, there is shown:

FIG. 2a shows in detail a configuration of switches used in a second branch of a sigma delta modulator.

FIG. 2b shows in detail a configuration of switches used in a third branch of a sigma-delta modulator.

FIG. 3 shows another feature of the present invention in order to solve a problem with parasitic capacitances. Charge errors caused by parasitic capacitances are eliminated by buffer amplifiers tracking the voltage on the integration capacitor nodes.

DESCRIPTION OF THE PREFERRED EMBODIMENTS

The preferred embodiments disclose methods and circuits for continuous time sigma-delta modulators. In a preferred embodiment such a delta-sigma modulator is used for battery management. The principle of the methods and circuits invented can be used also for many continuous-time modulators, because it replaces the necessity for return-to-zero code (RZ) and hence improves ISI and distortion. The disadvantage of RZ code is degrading of frequency characteristics.

The preferred embodiments have been implemented in an integrated circuit (IC) using CMOS-technology; other semiconductor technologies are also possible.

Figure 1:
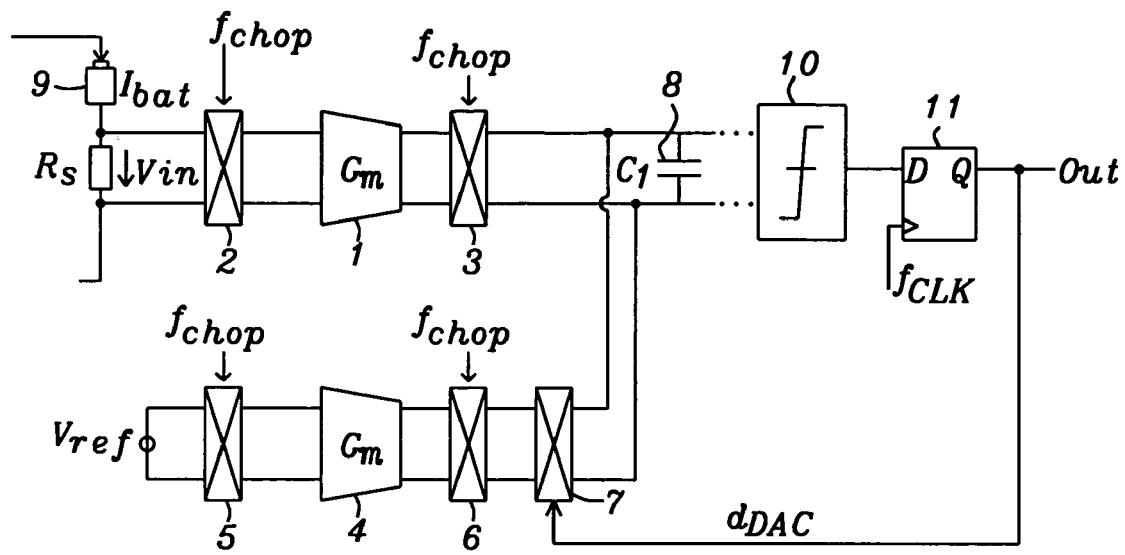
FIG. 1 shows a novel feature of a sigma-delta modulator used e.g. for battery management purposes. A DAC signal at the output is used to clock a chopping multiplexer in the current path of Gm in reference voltage branch.

FIG. 1 shows a novel feature of a sigma-delta modulator used for battery management purposes as a non-limiting example. A first stage of a sigma-delta modulator of FIG. 1 comprises a first differential Gm integrator 1, a chopping multiplexer 2 alternates with the chopping frequency $f_{chop}$ the polarity of the input voltage $V_{in}$ of the differential Gm integrator 1. In a preferred embodiment this input voltage Vin could be e.g. the voltage drop across a sense resistor $R_s$ wherein this sense resistor $R_s$ is a series resistor used for measurement of a current $I_{bat}$ generated by a battery 9. Another chopping multiplexer 3 alternates with the chopping frequency $f_{chop}$ the polarity of the output voltage of the differential Gm integrator 1.

Furthermore a chopping multiplexer 5 alternates with the chopping frequency $f_{chop}$ the polarity of a reference voltage $V_{ref}$ being input voltage of differential Gm integrator 4. A chopping multiplexer 6 alternates with the chopping frequency $f_{chop}$ the polarity of the output voltage of the differential Gm integrator 4.

For relative high voltages of $V_{ref}$ and if the offset of differential Gm integrator 4 is not dominating or not a problem, the chopping multiplexers 5 and 6 could be omitted.

In a preferred embodiment of the invention CMOS Operational Transconductance Amplifiers (OTA) have been used for the differential Gm integrators 1 and 2. They can be linearized by means of resistors either in the source path of the input transistor pair, or by using resistors in the input branch as in a preferred embodiment described here. Alternatively Operational Amplifiers (OpAmps) can be used, if they are configured as voltage-to-current converters (V-I converter).

An integrator capacitor 8 ends up the first stage of a sigma-delta modulator. Additional stages of the sigma-delta modulator are not shown in detail but indicated by the dotted lines. It has to be understood that any number of additional stages, signified by the dotted lines, can be used with the sigma delta modulator of the present invention. Alternatively other modulator topologies with additional feed-forward branches, more feedback branches or cascaded structures are possible. After the last stage a 1-bit quantizer 10 is shown. In a preferred embodiment the output is clocked by a positive edge triggered D-latch flip-flop 11, with $f_{clk}$ connected to the clock input of this flip-flop. Other switching means are possible as well to clock the output.

A DAC signal from the output is used to clock a chopping multiplexer 7, connected between chopping multiplexer 6 and the herewith the output of chopping multiplexer 3. A key point of the present invention shown in FIG. 1 is that the DAC signal has the highest frequency and needs most accurate switching characteristics. Therefore the DAC signal switches polarity via chopping multiplexer 7 the current in the current path in the output of differential Gm integrator 4. The advantage of switching the current polarity in the output path of Gm 4 instead of switching the input polarity of Vref is shorter settling time if $d_{DAC}$ changes its polarity.

The sequence of choppers 6 and 7 can be interchanged; also the choppers can be functionally combined in a single switch matrix controlled by a logic circuit, which is controlled, by signals $f_{chop}$ and $d_{DAC}$. Replacing chopper 6 and 7 by an integrated switch would yield a lower series resistance and lower parasitic capacitances in the signal path.

The chopping multiplexers 7 are driven by frequency $f_{clk}$, which is a regular clock and has the highest switching frequency in the system. $d_{DAC}$ is a logic signal that can change on the rising edge of this clock signal. Quantizer 10 and flipflop 11 can be implemented by a clocked comparator with a latch at the output.

Figure 6:
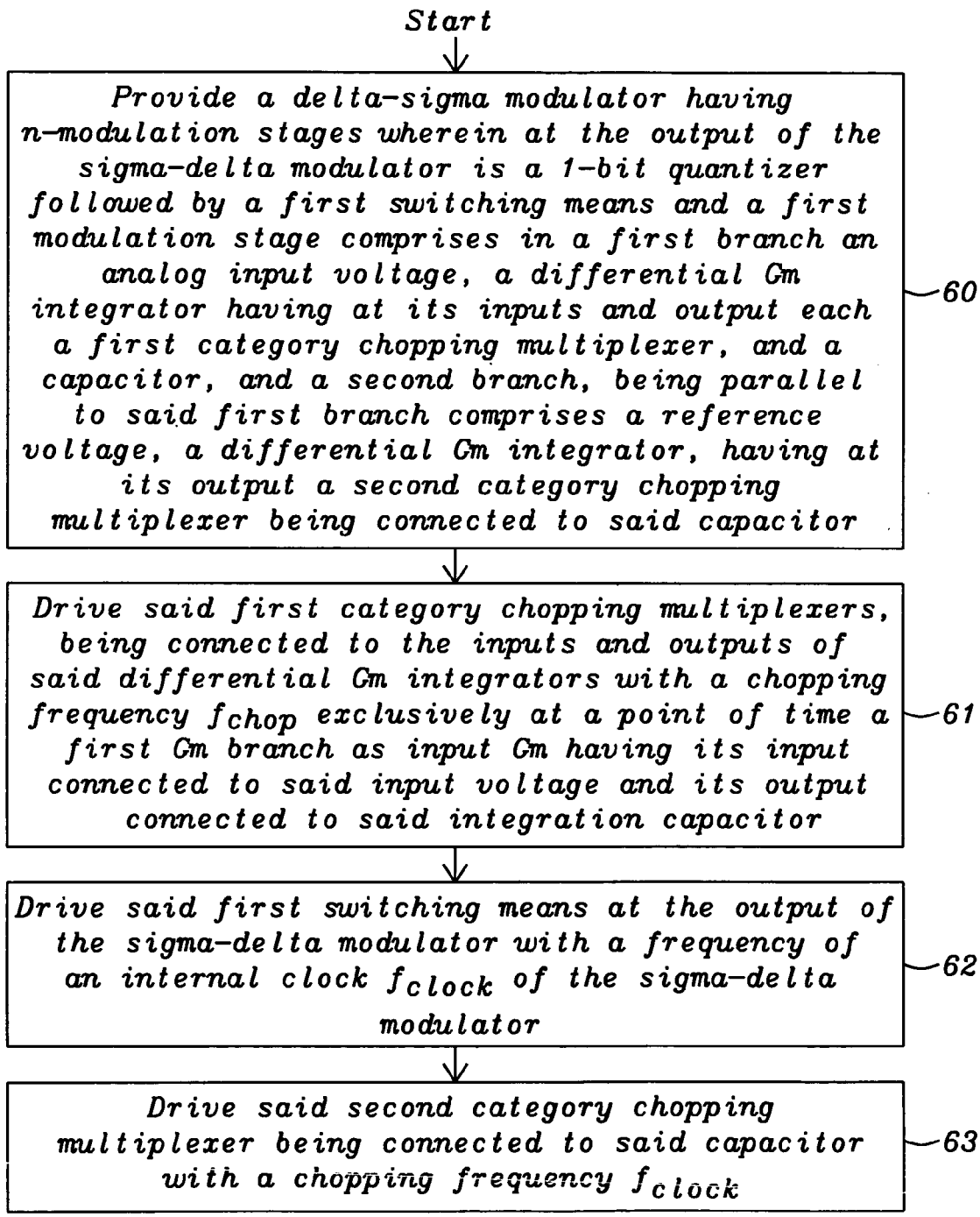
FIG. 6 shows a flowchart of a method to achieve accurate switching characteristics of a delta-sigma-modulator having two integration branches.

FIG. 6 shows a flowchart of a method to achieve accurate switching characteristics of a delta-sigma-modulator having two integration branches. According to the circuit of FIG. 1 Step 60 shows the provision of a delta-sigma modulator having n-modulation stages wherein at the output of the sigma-delta modulator is a 1-bit quantizer followed by a first switching means. The first modulation stage comprises in a first branch an analog input voltage, a differential Gm integrator, having at its inputs and output each a first category chopping multiplexer, and a capacitor, and a second branch, being parallel to said first branch comprises a reference voltage, a differential Gm integrator, having at its output a second category chopping multiplexer being connected to said capacitor. The following step 61 describes the driving of the first category chopping multiplexers, being connected to the inputs and outputs of said differential Gm integrators, with a chopping frequency $f_{chop}$ exclusively at a point of time a first Gm branch as input Gm having its input connected to said input voltage and its output is connected to said integration capacitor. The next step 62 illustrates the driving of said first switching means at the output of the sigma-delta modulator with a frequency of an internal clock $f_{clock}$ of the sigma-delta modulator. The last step of the this method shows the driving of said second category chopping multiplexer being connected to said capacitor with a chopping frequency $f_{clock}$.

Figure 2:
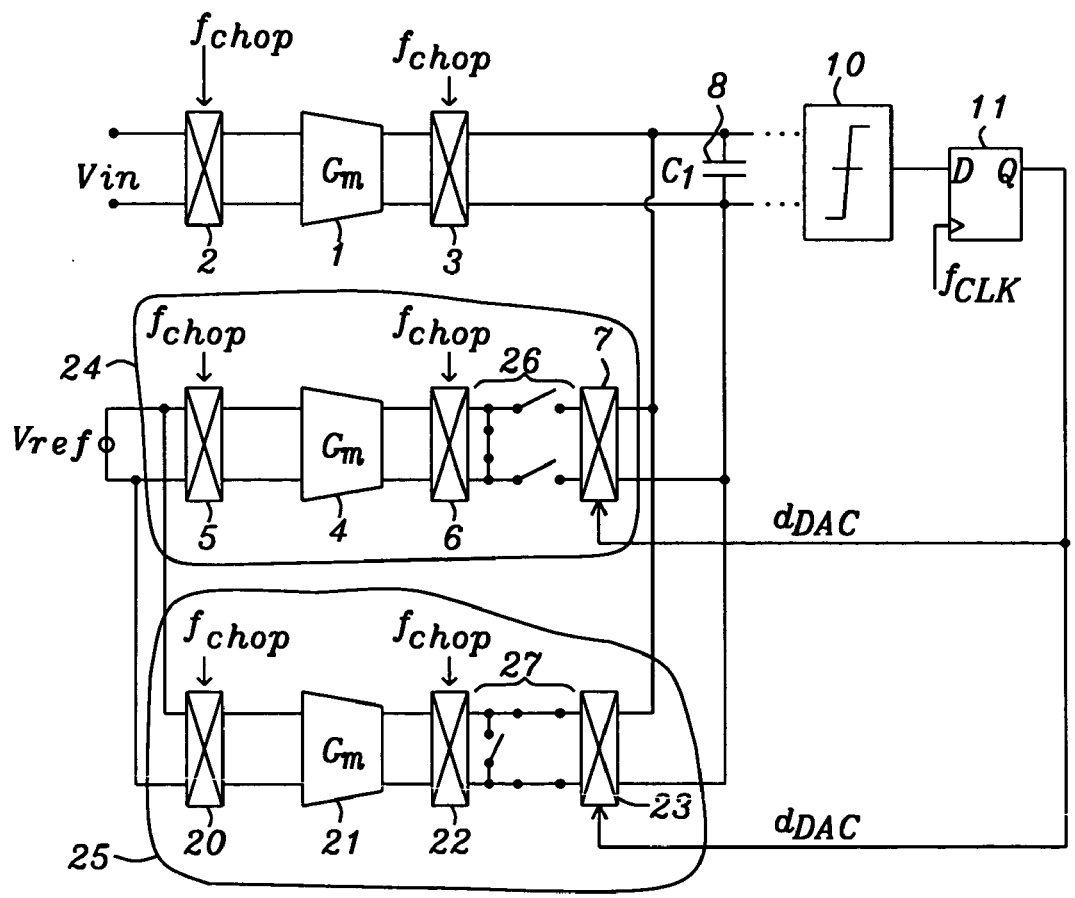
FIG. 2 shows a novel feature of a sigma-delta modulator used e.g. for battery management purposes. A DAC signal at the output is used to clock a chopping multiplexer in the current path of Gm in reference voltage branch and a chopping multiplexer in the current path of Gm in a branch parallel to the reference voltage branch.

Return-to-zero (RZ) describes a line code in which the signal drops (returns) to zero between each pulse. This takes place even if a number of consecutive zeros or ones occur in the signal. This means that a separate clock does not need to be sent alongside the signal. The signal is self-clocking. The return-to zero principle can minimize inter-symbol references und thus minimizes distortions. FIG. 2 shows how the return to-zero principle can be improved by using two current sources 24 and 25 for the DAC signal. Compared to the embodiment shown in FIG. 1 a second current source 25 has been added comprising a multiplexing chopper 20 at the input of a differential Gm integrator 21, a multiplexing chopper 22 at the output of a differential Gm integrator 21, both driven by frequency $f_{chop}$, and multiplexing chopper 23. The DAC signal at the output is used to clock this chopping multiplexer 23, which is likewise to chopping multiplexer 7 driven by the logic signal $d_{DAC}$ of the DAC. At any point of time one of the two current sources 24 and 25 must be disconnected and shorted, therefore the switching configuration 26, shown in FIG. 2a, has been added to current source 24 and switching configuration 27, shown in FIG. 2b, has been added to current source 25. The sequence of chopper 6, switches 26 and DAC driven chopper 7 in current source 24 can be interchanged as well as the sequence chopper 22, switches 27 and DAC driven chopper 23 in current source 25.

Switches 26 and 27 are driven by $f_{clk}/2$. Switch 261 and 262 are driven by an inversed frequency $f_{clk}/2$ compared to switch 263. Switch 273 is driven by an inversed frequency $f_{clk}/2$ compared to switches 271 and 273. Chopper switch 6, switches 26 and DAC-chopper-switch 7, can be interchanged and the related switches in series can be combined to a single switch to reduce series resistance and parasitic capacitances in the signal path. The resulting combined switches are then driven by a logic that has fchop, $d_{DAC}$ and $f_{clk}/2$ as input.

Figure 7:
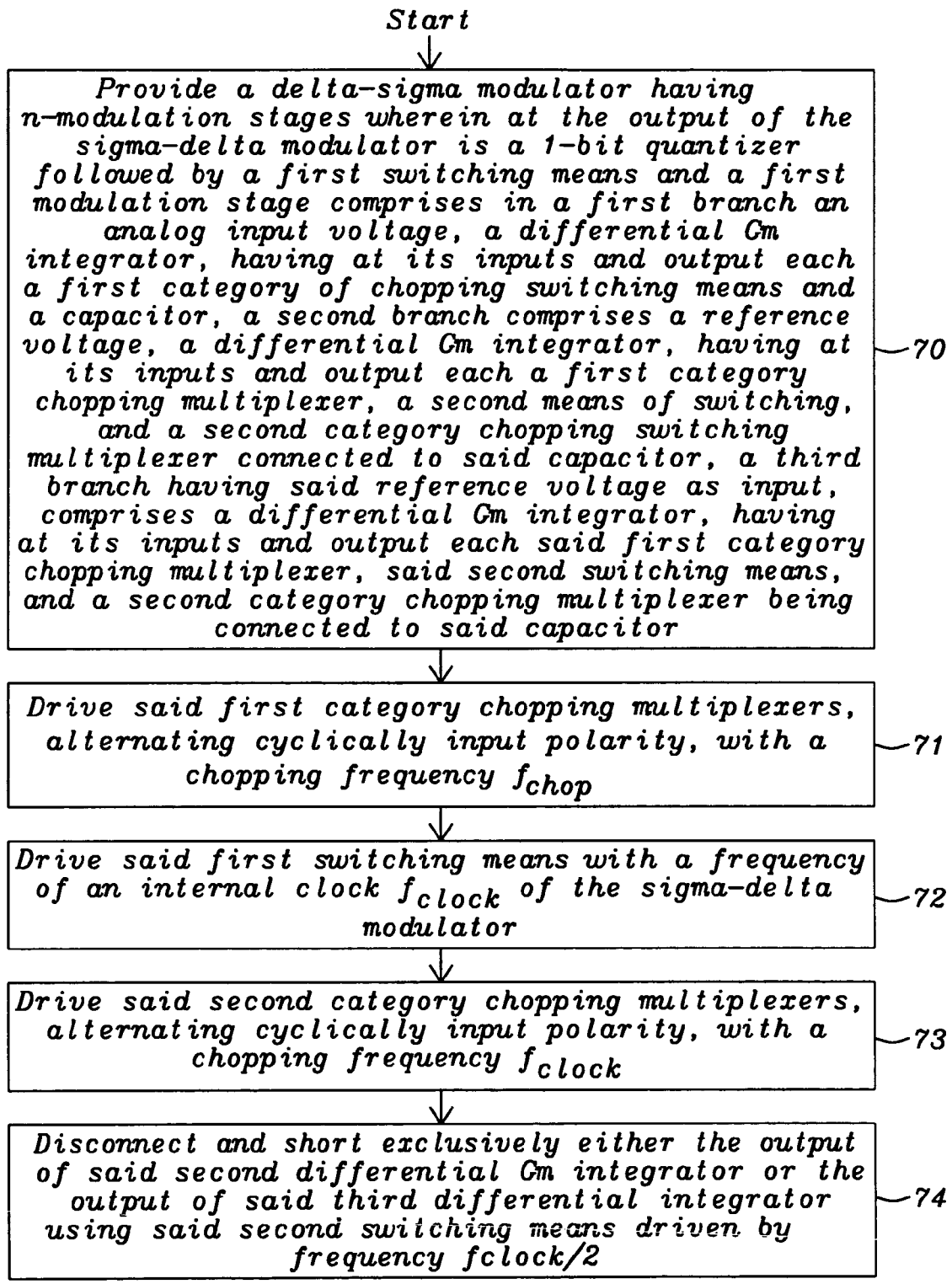
FIG. 7 shows a flowchart of a method to achieve accurate switching characteristics of a delta-sigma-modulator having three integration branches.

FIG. 7 shows a flowchart of a method to achieve accurate switching characteristics of a delta-sigma-modulator having three integration branches. The first step 70 shows, according to the circuit of FIG. 2, the provision of a delta-sigma modulator having n-modulation stages wherein at the output of the sigma-delta modulator is a 1-bit quantizer followed by a first switching means. The first modulation stage comprises in a first branch an analog input voltage, a differential Gm integrator, having at its inputs and output each a first category of chopping switching means and a capacitor. A second branch comprises a reference voltage, a differential Gm integrator, having at its inputs and output each a first category chopping multiplexer, a second means of switching, and a second category chopping switching multiplexer connected to said capacitor. A third branch, having said reference voltage as input, comprises also a differential Gm integrator, having at its inputs and output each said first category chopping multiplexer, said second switching means, and a second category chopping multiplexer being connected to said capacitor. The following step 71 shows the driving of said first category chopping multiplexers, alternating cyclically input polarity, with a chopping frequency $f_{chop}$. The next step 72 illustrates the driving of said first switching means with a frequency of an internal clock $f_{clock}$ of the sigma-delta modulator, followed by step 73 describing the driving of said second category chopping multiplexers, alternating cyclically input polarity, with a chopping frequency $f_{clock}$, followed by step 73 illustrating driving said second category chopping multiplexers, alternating cyclically input polarity, with a chopping frequency $f_{clock}$. The last step 74 shows that either the output of said second differential Gm integrator or the output of said third differential integrator is disconnected and shortened using said second switching means driven by frequency $f_{clock}/2$.

FIG. 3 shows another feature of the present invention in order to solve a problem with parasitic capacitances. As example FIG. 3 shows the input path of a first modulation stage of a sigma-delta modulator with chopping multiplexer 2, differential Gm integrator 1, chopping multiplexer 3 and a first integration capacitor C1. Every-time when the parasitic capacitances, indicated in FIG. 3 by $C_{P1}$ to $C_{P4}$, are switched or reconnected to the integration capacitor 8 a charge error occurs. The charge error can be eliminated or at least minimized if the output nodes are pre-charged using buffer amplifiers 32 that track the voltage on the integrator capacitor nodes. Voltage overshoots are avoided by using buffer amplifiers as shown in FIG. 3. These buffer amplifiers can be implemented to eliminate charge errors for all other differential Gm integrators used in a sigma-delta modulator. In a preferred embodiment the buffer Amp has been realized by a source follower, even if the gain of this buffer is smaller than one. Other conventional realizations of a buffer amplifier are possible as well.

Switches 31 are driven with the inverted signal of switches 30. Non-overlapping switching and a minimum time slot between switching 30 and 31 has to be assured. Gm 1 has a so-called current or high impedance output that is sinked by the buffer 32. The buffer could be a simple circuit comprising a source follower.

This pre-charging of output nodes using a buffer amplifier can be used for every integration stage of a sigma-delta modulator. This principle using buffer amplifiers to eliminate charge errors can be used in other switched circuits as well.

Figure 8:
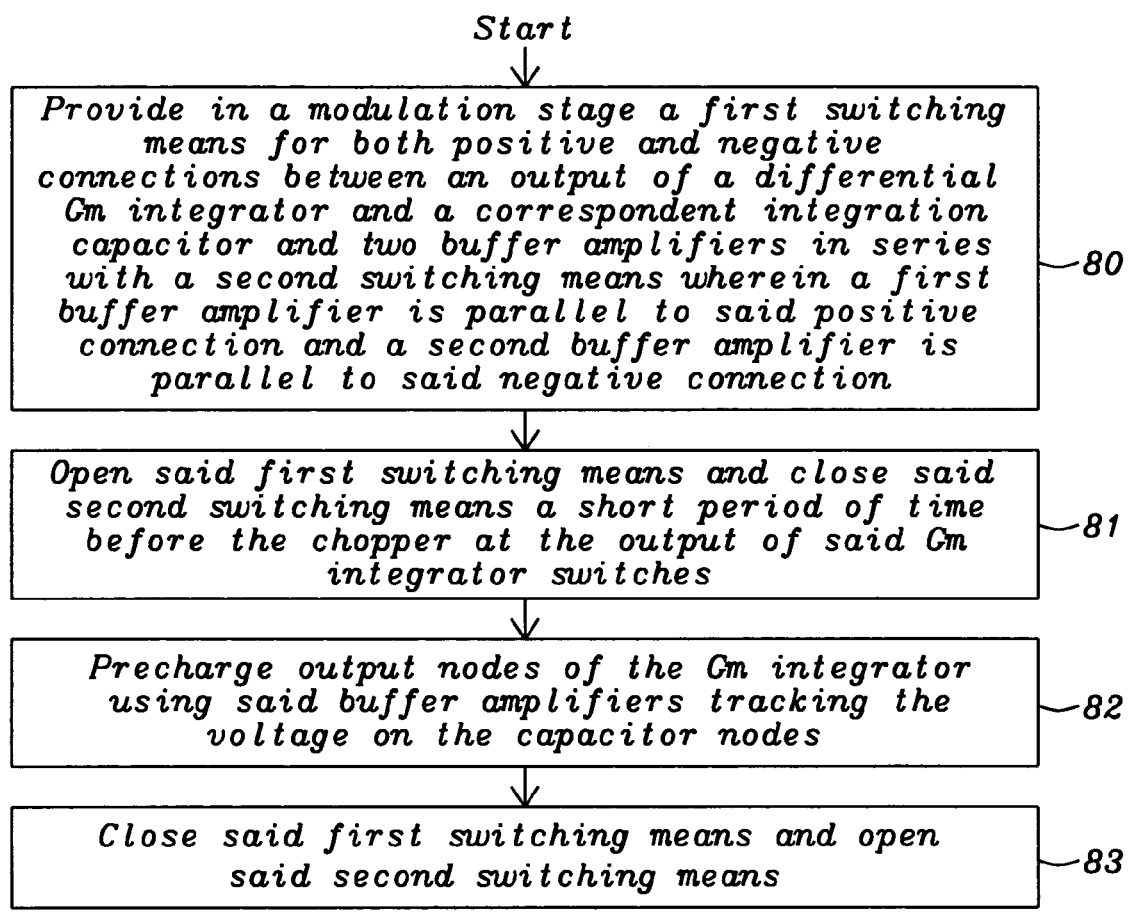
FIG. 8 illustrates a flowchart of a method to eliminate charge errors caused by parasitic capacitances of delta-sigma modulators.

FIG. 8 illustrates a flowchart of a method to eliminate charge errors caused by parasitic capacitances of delta-sigma modulators. The first step 80 shows the provision of a modulation stage with a first switching means for both positive and negative connections between an output of a differential Gm integrator and a correspondent integration capacitor and two buffer amplifiers in series with a second switching means wherein a first buffer amplifier is parallel to said positive connection and a second buffer amplifier is parallel to said negative connection.

The next step 81 comprises to open said first switching means and to close said second switching means a short period of time before the chopper at the output of said Gm integrator switches. In the following step 82 the output nodes of the Gm integrator are precharged using said buffer amplifiers tracking the voltage on the capacitor and in the last step 83 the first switching means are closed and the second switching means are opened.

Figure 4:
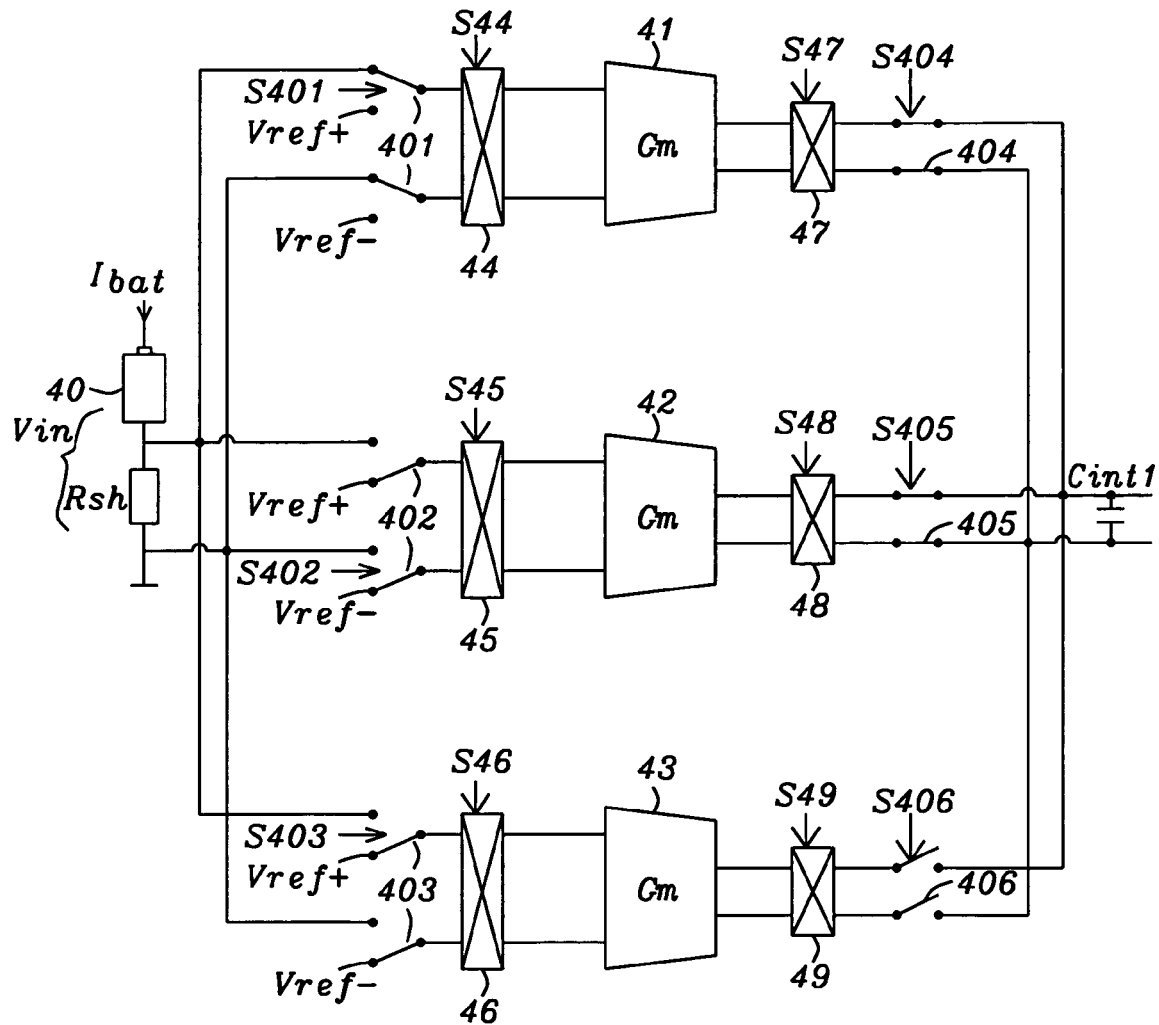
FIG. 4 shows a first stage of a sigma-delta modulator having three differential Gm stages in parallel.

FIG. 4 shows another novel feature of a sigma-delta modulator. It shows a first stage of a sigma-delta modulator having three parallel differential Gm integrator stages 41-43. These three integrators ensure a continuous integration of analog input by a special switching principle. As a non-limiting example of application in a preferred embodiment the input voltage Vin is a voltage drop across a sense resistor $R_{sh}$ wherein this sense resistor $R_{sh}$ is a series resistor used for measurement of a current $I_{bat}$ generated by battery 40.

Cross switches 44 and 47 are connected to the input or correspondently to the output of differential Gm integrator 41, cross switches 45 and 48 are connected to the input resp. the output of differential Gm integrator 42, and cross switches 46 and 49 are connected to the input resp. the output of differential Gm integrator 43. Furthermore FIG. 4 shows the integration capacitor $C_{int1}$ of this first modulator stage. Three pairs of switches 401, 402, and 403 connect the input of a correspondent differential Gm integrator 41, 42 or 43 to either input voltage Vin or to a reference voltage $V_{ref}$. Switches 404, 405 and 406 connect the output of correspondent differential Gm integrators 41, 42 or 43 to the integration capacitor C1 of the first modulation stage output.

An additional clock fclock_del that is delayed e.g. 500 nsec against the original clock is used as additional signal in the logic block that controls the set-up of the pre-run mode.

The control signals for switches 44-49 are signified by numerals S44-S49 in FIG. 4, the control signals for switches 410-406 are signified by numerals S401-S406. These control signals S44-S49 and S401-S406 come out of a digital control block (not shown). This digital control block comprises an asynchronous digital logic, wherein input signals to this logic are fclock, delayed fclock_del, and $d_{DAC}$.

The first integrator stage shown in FIG. 4 comprises a first $G_m$ 41 forming a first coefficient of the modulator for the input path signal, and a second Gm 42 forming a second coefficient for the feedback path of the modulator at the point of time illustrated in FIG. 4.

A $3^{rd}$ $G_m$ 43 that is disconnected from the integration capacitor $C_{int1}$ at the point of time illustrated in FIG. 4 is forerunning in case the DAC is altering the sign or $G_m$ 41 forming the first input-coefficient is chopped. Switch 403 must is connected to $V_{ref}$ because Gm 43 is in forerunning-mode for Gm 42. FIG. 4 shows the 3 $G_m$'s 41-43 forming the $1^{st}$ integrator stage. Every $G_m$ can either be connected to the shunt Rsh ($V_{in}$) or to the reference voltage $V_{ref}$. Cross-switches 44-49 are in the input path and cross-switches 47-49 are in the output path to perform the chopping or the sign altering of the DAC. A pair of cross-switches in a input path and in a correspondent output path can both be switched independently, in case of chopping they are switched synchronous, in case of DAC sign altering the input and output switch are altered independently. Every $G_m$ is realized by an OTA. The output of the OTA's is connected via cross-switch and connection-switch to the integration capacitor $C_{int1}$.

At the point of time shown in FIG. 4 the $3^{rd}$ disconnected $G_m$ 43 is forerunning the following clock phase when the DAC sign changes or when the $G_m$ is chopped. The altering of the DAC sign must be performed synchronously to the rising slope of the low jitter RT clock. Hence the unconnected $G_m$ is forerunning connected to the opposite sign of $V_{ref}$ during the low phase of a real-time (RT) clock, and it is forerunning as input $G_m$ if the RT clock phase is high.

Figure 5:
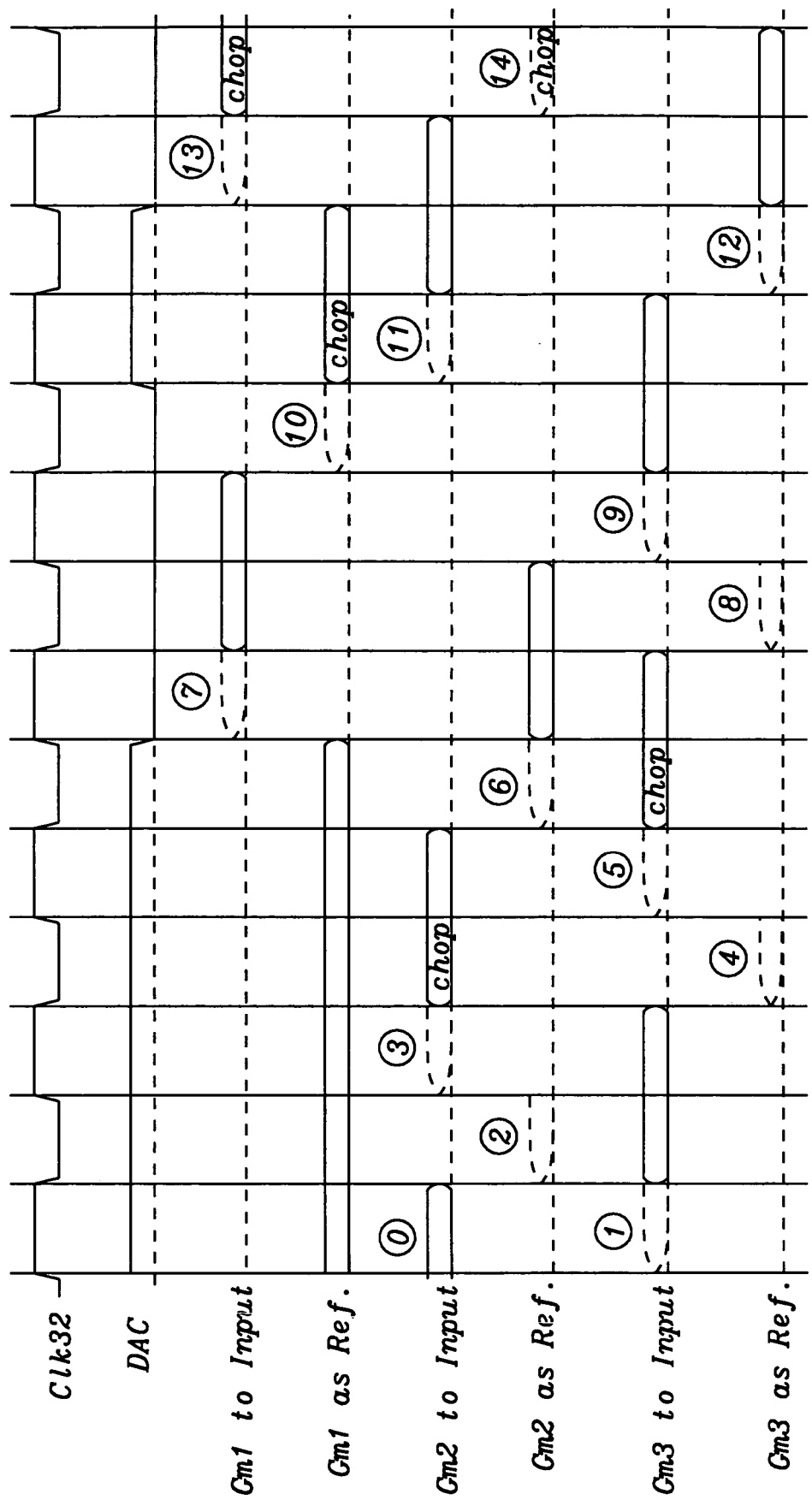
FIG. 5 shows time charts of pulses of a sigma-delta modulator invented having three integrators in a first stage.

FIG. 5 illustrates the function of the forerunning unconnected $G_m$ and shows time-charts of the main signals of the circuit invented. The circled numbers signify phases 0-14. All signals change on the clock edges of the RT clock Clk32. The logical DAC signal from the output of the sigma-delta modulator (as shown in FIGS. 1 and 2) changes with the rising edge of Clk32, and it is important that the jitter of this clock and the jitter added by the control logic switching the DAC between the $G_m$-channels is minimized. The DAC sign is ON during phases 0-6 and during phases 11-12. The channels Gm1, Gm2 and Gm3 are drawn in dotted lines if the output of the channel is disconnected from the first integration capacitor Cint, this means the channel is in the forerunning mode.

The input of channel Gm1 is connected to the DAC (Vref) during phases 0-6, to the shunt resistor $R_{sh}$ during phases 7-9, to the DAC again during phases 10-12, and to the shunt resistor $R_{sh}$ again during phases 13 and 14. Connected to the DAC means that the input of the related channel is connected to the reference voltage Vref and the cross switches at the input and output of the related Gm are driven by the $d_{DAC}$ signal from the output of the sigma-delta modulator (as shown in FIGS. 1 and 2).

In phase 7 $G_{m1}$ is gets disconnected from the integration capacitor $C_{int1}$ and connected to the shunt, this means it is forerunning as input Gm. During phases 8 and 9 $G_{m1}$ is operating as input Gm, its input is connected to the input voltage and its output is connected to the integration capacitor $C_{int1}$. During phase 10 $G_{m1}$ is disconnected from the integration capacitor $C_{int1}$, this means it is forerunning as DAC Gm, this means it's input is connected to $V_{ref}$ driven by $d_{DAC}$ signal during this phase. During phases 11 and 12 $G_{m1}$ is in the DAC mode again. During phase 13 $G_{m1}$ is disconnected from the integration capacitor $C_{int1}$ and connected to the shunt, this means it is forerunning as input Gm again and in phase 14 integration capacitor $G_{m1}$ is in input mode, being connected to the shunt and to the integration capacitor $C_{int1}$. The input of channel Gm2 is connected to the shunt resistor $R_{sh}$ during phases 0-1 as input Gm, to the DAC during phase 2, to the shunt resistor $R_{sh}$ again during phases 3-5, to the DAC again during phases 6-10, to the shunt resistor $R_{sh}$ during phases 11-13, and, to the DAC again during phase 14. During phases 2, 6 and 14 Gm2 is disconnected to the integration capacitor $C_{int1}$, this means it is forerunning as DAC Gm. During phase 11 $G_{m2}$ is disconnected to the integration capacitor $C_{int1}$, this means it is forerunning as input Gm.

The input of channel $G_{m3}$ is connected to the DAC ($V_{ref}$) during phases 0, 4, 8, and 12-14. During phases 1-3, 5-7, and 9-11 the input of channel Gm3 is connected to the shunt resistor $R_{sh}$. During phases 1, 5 and 9 $G_{m3}$ is disconnected to the integration capacitor $C_{int1}$, this means it is forerunning as input Gm. During phases 4, 8, and 12 $G_{m3}$ is disconnected to the integration capacitor $C_{int1}$, this means it is forerunning as DAC Gm because it's input is connected to $V_{ref}$ during these phases.

The transition between $G_{m2}$ in phase 1 and $G_{m3}$ in phase 2 is not jitter sensitive. Jitter sensitive are transitions as between phase 6 and 7, when the DAC polarity changes. If the DAC polarity does not change, the input-$G_m$ toggles between channel 2 and 3, as can be seen on phase 1, 3 and 5. If the DAC polarity changes, as during the transition between phases 6 and 7, the DAC channel must change, because there is no settling time allowed, which would behave like jitter or noise on the reference and which would degrade the S/N ratio. The settling of a new channel operated as DAC is done in the low phases of the RT clock Clk32, as in phase 2, 4 and 6.

For 1/f noise suppression of the OTAs the $G_m$ must be chopped. Chopping of a channel can be performed when the corresponding channel function is disconnected and connected again later, i.e. $G_{m2}$ at the end of phase 1 and at the start of phase 4. In phase 4 and 5 the OTA of channel 2 is operated with chopped input and output. Also in case when a channel operates as DAC the OTA can be chopped, but due to the large reference voltage and the modulation with white quantization noise of the modulator the low noise and offset suppression is not so important. Whether a channel is operated in chopped or in non-chopped mode, depends on the chop-state at which the channel was operated with the same function. I.e. in phase 13 Gm1 is operated chopped, because in phase 13 it is connected to the measure input, and in phase 7 to 9, when it was previously connected to the shunt, it was operated non-chopped. Whether it was operated chopped or not in phase 10 to 12, when it was operated as DAC, does not matter.

The chop frequency of the measure input is effectively reduced due to the channel selection and clocking scheme. In case of a constant comparator and not-changing DAC, two channels share the measurement of the input, 50% of each channel time period is used for the forerunning mode. Hence the maximum chop frequency is half the clock $f_{clock}$ frequency of the comparator of the modulator. But noise after chopping is further reduced by averaging the integration currents of 2 or 3 channels. The equivalent chopping-frequency resulting from the cycling of the 3 integrators (Gm) is below half the clock frequency.

The exact value of Gm can be determined by the design parameters (W/L) of the input transistors of an OTA, or accordingly by using linearization resistors inside or outside the OTA, or by using an OpAmp in V-I-converter configuration.

In most applications the overall performance of the sigma-delta modulator depends mainly on the accuracy of the first integrator stage. Furthermore the signal on the first integrator capacitor, this means after the first Gm stage, is large enough, so that non-ideal parasitic influences of the following Gm stages do not affect the overall system performance. Therefore a differential Gm integrator configuration comprising 3 differential Gm integrators as shown in FIG. 4 is required for the first modulation stage only. The following modulation stages require one differential Gm integrator only. Under special circumstances the differential Gm integrator configuration comprising 3 differential Gm integrators as shown in FIG. 4 could be used in other modulation stages as well.

One of the three differential Gm integrator stages 41-43 can be run cyclically interchanged in a so called pre-run-mode. The pre-run mode allows the settling of voltages and currents inside and outside the Gm. Voltage overshoots are avoided by shorting the pre-running OTA output or by using a buffer like shown in FIG. 3. The pre-running differential Gm integrator is not connected to zero as in prior art (ISSCC' 02: "A 10 μV-offset 8 kHz Bandwidth 4$^{th}$ order Chopped sigma-Delta A/D converter for Battery management"), but to the input voltage or the reference voltage, depending on what this differential Gm integrator will be used in the following clock period.

Figure 9:
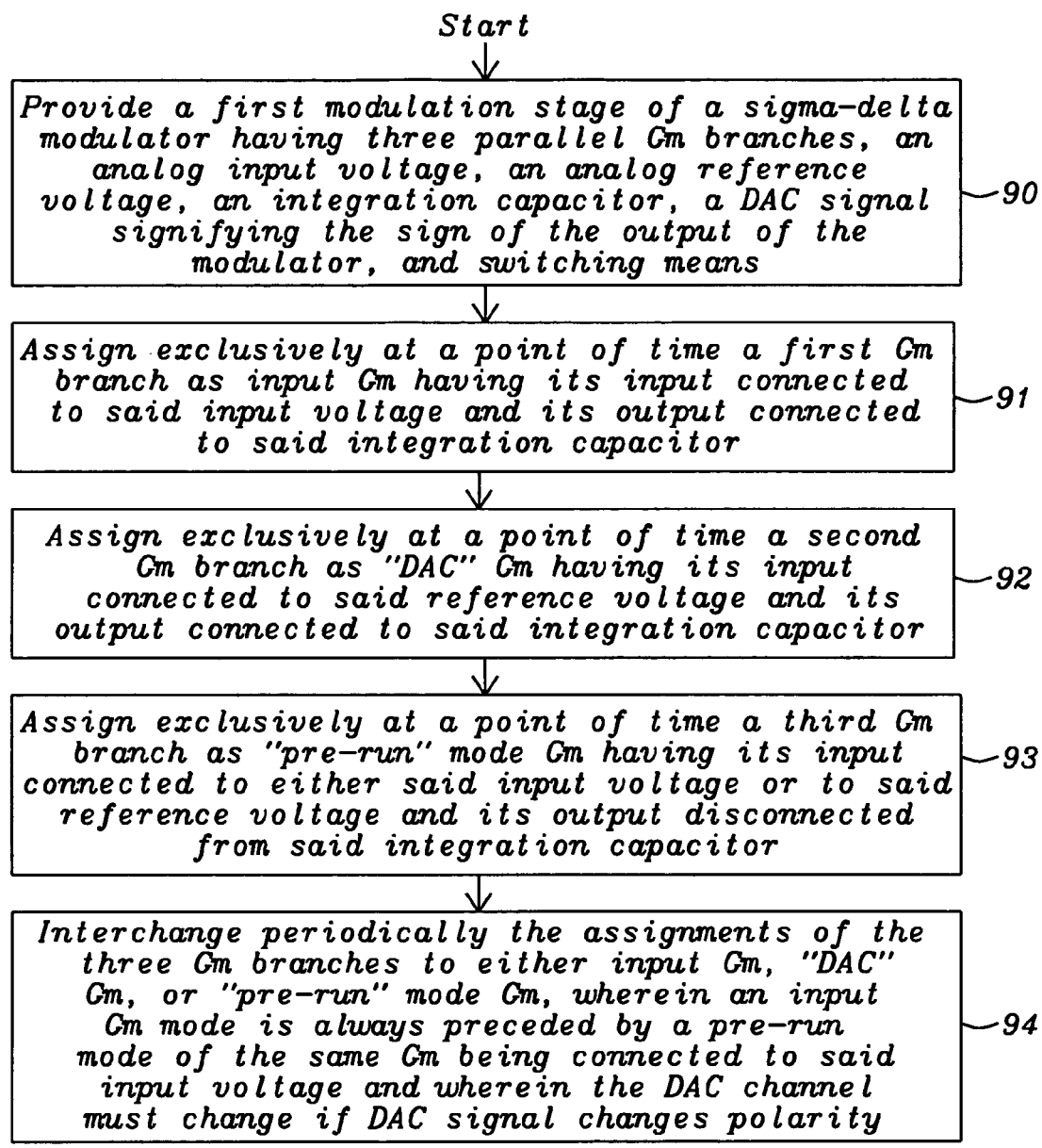
FIG. 9 shows a flowchart of a method to achieve accurate switching characteristics of a delta-sigma-modulator having three integration branches according to the circuit of FIG. 4.

FIG. 9 shows a flowchart of a method to achieve accurate switching characteristics of a delta-sigma-modulator having three integration branches according to the circuit of FIG. 4. The first step 90 shows the provision of a first modulation stage of a sigma-delta modulator having three parallel Gm branches, an analog input voltage, a analog reference voltage, an integration capacitor, a DAC signal signifying the sign of the output of the modulator, and of switching means. The following step 91 describes that exclusively at a point of time a first Gm branch is assigned as input Gm having its input connected to said input voltage and its output connected to said integration capacitor. In step 92 exclusively at a point of time a second Gm branch is assigned as "DAC" Gm having its input connected to said reference voltage and its output connected to said integration capacitor, followed by step 93 wherein exclusively at a point of time a third Gm branch is assigned as "pre-run" mode Gm having its input connected to either said input voltage or to said reference voltage and its output disconnected from said integration capacitor. The last step 94 describes that the assignments of the three Gm branches to either input Gm, "DAC" Gm, or "pre-run" mode Gm are interchanged periodically, wherein an input Gm mode is always preceded by a pre-run mode of the same Gm being connected to said input voltage and wherein the DAC channel must change if DAC changes polarity.

While the invention has been particularly shown and described with reference to the preferred embodiments thereof, it will be understood by those skilled in the art that various changes in form and details may be made without departing from the spirit and scope of the invention.

What is claimed is:

1. A method to achieve accurate switching characteristics of a delta-sigma-modulator comprising the steps of:
   providing a delta-sigma modulator having n-modulation stages comprising in a first branch an analog input voltage, a first differential Gm integrator, and a capacitor, in a second branch, being parallel to said first branch, a reference voltage, a second differential Gm integrator, having its output connected to said capacitor;
   chopping inputs and outputs of said first differential Gm integrator with a chopping frequency $f_{chop}$;
   chopping the output of the sigma-delta modulator with a frequency of an internal clock $f_{clock}$ of the sigma-delta modulator wherein the frequency of fclock is higher than said frequency $f_{chop}$; and
   chopping the output of said second differential Gm integrator, connected to said capacitor, with a chopping frequency $f_{clock}$.

2. The method of claim 1 wherein said analog input voltage is a voltage drop at a sense resistor to measure a current from a battery.

3. The method of claim 1 wherein said second differential Gm integrator has its input and output chopped by said frequency $f_{chop}$.

4. The method of claim 3 wherein said chopping at the output of said second differential Gm is performed by a single switch matrix controlled by a logic circuit which is controlled by said signals $f_{chop}$ and $f_{clock}$.

5. The method of claim 1 wherein said chopping of the output of the delta-sigma modulator is performed by a flip-flop.

6. The method of claim 1 wherein the output nodes of said differential Gm integrators are pre-charged using a buffer amplifier tracking the voltage on said capacitor.

7. The method of claim 1 wherein said second differential Gm integrator and said third Gm integrator have each their input and output chopped by said frequency $f_{chop}$.

8. The method of claim 7 wherein said chopping at the outputs of each of said second and third differential Gm integrator is performed by each a single switch matrix controlled by a logic circuit which is controlled by said signals $f_{chop}$, $f_{clock}$ and $f_{clock}/2$.

9. A method to achieve accurate switching characteristics of a delta-sigma-modulator by improving return-to zero principle minimizing inter-symbol references is comprising the steps of:
   providing a delta-sigma modulator having n-modulation stages wherein a first modulation stage comprises in a first branch an analog input voltage, a first differential Gm integrator and a capacitor, a second branch comprises a reference voltage as input to a second differential Gm integrator and a third branch, having said reference voltage as input, comprises a third differential Gm integrator;
   chopping input and output of said first differential GM integrator with a chopping frequency $f_{chop}$;

chopping the output of the sigma-delta modulator with a frequency of an internal clock $f_{clock}$ of the sigma-delta modulator, wherein the frequency of $f_{clock}$ is higher than said frequency $f_{chop}$;

chopping the outputs of second Gm integrator and of said third Gm integrator both connected to said capacitor, with said chopping frequency $f_{clock}$; and disconnect and short exclusively either the output of said second differential Gm integrator or the output of said third differential integrator with frequency $f_{clock}/2$.

10. The method of claim 9 wherein said analog input voltage is a voltage drop at a sense resistor to measure a current from a battery.

11. The method of claim 9 wherein said chopping of the output of the delta-sigma modulator is performed by a flip-flop.

12. The method of claim 9 wherein the output nodes of each of said differential Gm integrators are pre-charged using a buffer amplifier tracking the voltage on said capacitor.

13. A delta-sigma modulator having accurate switching characteristics comprises n-modulation stages and at its output a 1-bit quantizer followed by an output switching means, clocked by an internal clock, and wherein its first modulation stage comprises an analog input voltage to be converted to a digital voltage;

an analog reference voltage, an integration capacitor at the output of said first stage being connected to following modulation stages of said sigma-delta modulator; and three parallel integrating branches comprising each:

a first switching means switching between said analog input voltage and said analog reference voltage;

a second switching means, alternating cyclically the polarity of its input wherein its input is connected to said first switching means and its output is connected to the input of a first differential Gm integrator;

said first differential Gm integrator wherein its output is the input to a third switching means;

said third switching means, alternating cyclically the polarity of its input from said first differential Gm integrator and its output is connected to fourth switching means; and said fourth switching means connecting or disconnecting the output of said third switching means to said integration capacitor.

14. The delta-sigma modulator of claim 13 wherein said analog input voltage is a voltage drop across a sense resistor to measure a current from a battery.

15. The delta-sigma modulator of claim 13 being implemented in an integrated circuit.

16. The delta-sigma modulator of claim 13 wherein all said switching means is controlled by a logic circuit.

17. The delta-sigma modulator of claim 16 wherein said logic circuit ensures via said switching means that exclusively but periodically interchanged a first of said three integrating branches is connected at its input to said input voltage and at its output to said integration capacitor, a second of said three integrating branches is connected at its input to said reference voltage and at its output to said integration capacitor, and a third of said three integrating branches is connected in a forerunning mode at its input to either said input voltage or said reference voltage and at its output is disconnected from integration capacitor.

18. The delta-sigma modulator of claim 13 wherein said differential Gm integrators are realized by Operational Amplifiers configured as voltage to current converters.

19. The delta-sigma modulator of claim 13 wherein the output nodes of each of said differential Gm integrators are pre-charged using a buffer amplifier tracking the voltage on said capacitor.

20. A method to eliminate charge errors caused by parasitic capacitances of an output of Gm integrators when switching to an integration capacitor occurs, comprising steps of:

providing in a modulation stage a differential Gm integrator, a chopper alternating the polarity of the Gm integrator, a correspondent integration capacitor and two buffer amplifiers in series with a second switching means wherein a first buffer amplifier is parallel to said positive connection and a second buffer amplifier is parallel to said negative connection;

connecting said buffer amplifiers to output nodes of said Gm integrator;

precharging output nodes of the Gm integrator a short period of time before said chopper switches using said buffer amplifiers tracking the voltage on the capacitor nodes; and disconnecting said buffer amplifiers from said output nodes.

21. The method of claim 20 wherein the method invented is used for a first modulation stage of a sigma-delta modulator.

22. A circuit to eliminate charge errors caused by parasitic capacitances due to switching at integration capacitor of a modulation stage of a sigma-delta modulator comprises:

an integration capacitor;

a first switching means in both connections between a chopped output of a differential Gm-integrator and said integration capacitor of the first modulation stage, two buffer amplifier each in series with a second switching means wherein each of said buffer amplifiers is in parallel to one of both connections between said capacitor and said chopped output and wherein the input of said buffer amplifiers is on the side of a terminal of said integration capacitor.

23. The circuit of claim 22 wherein said buffer amplifiers are realized by source followers.

24. A method to achieve accurate switching characteristics of a delta-sigma-modulator is comprising steps of:

providing a first modulation stage of a sigma-delta modulator having three parallel Gm branches each comprising switching means and a differential Gm integrator, an analog input voltage, an analog reference voltage, an integration capacitor, and a DAC signal signifying the sign of the output of the modulatory;

assigning exclusively at a point of time a first Gm branch as input Gm having its input connected to said input voltage and its output connected to said integration capacitor;

assigning exclusively at a point of time a second Gm branch as "DAC" Gm having its input connected to said reference voltage and its output connected to said integration capacitor;

assigning exclusively at a point of time a third Gm branch as "pre-run" mode Gm having its input connected to either said input voltage or to said reference voltage and its output disconnected from said integration capacitor; and interchanging periodically the assignments of the three Gm branches to either input Gm, "DAC" Gm, or "pre-run" mode Gm, wherein an input Gm mode is always preceded by a pre-run mode of the same Gm being connected to said input voltage and wherein the DAC channel must change if DAC changes polarity.

25. The method of claim 24 wherein chopping in a Gm channel is performed when a corresponding channel mode has been previously disconnected and is connected again.

26. The method of claim 24 wherein output nodes of each of said differential Gm integrators are pre-charged using a buffer amplifier tracking the voltage on said capacitor.

* * * * *